(12) United States Patent
Jo et al.

(10) Patent No.: US 11,387,409 B1
(45) Date of Patent: Jul. 12, 2022

(54) FORMATION OF STRUCTURALLY ROBUST NANOSCALE AG-BASED CONDUCTIVE STRUCTURE

(71) Applicant: Crossbar, Inc., Santa Clara, CA (US)

(72) Inventors: Sung Hyun Jo, Sunnyvale, CA (US); Xianliang Liu, Emeryville, CA (US); Fnu Atiquzzaman, Berkeley, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 16/688,640

(22) Filed: Nov. 19, 2019

Related U.S. Application Data

(62) Division of application No. 15/185,256, filed on Jun. 17, 2016, now Pat. No. 10,483,462.

(60) Provisional application No. 62/181,051, filed on Jun. 17, 2015.

(51) Int. Cl.
*H01L 45/00* (2006.01)
*G11C 11/56* (2006.01)

(52) U.S. Cl.
CPC ........ *H01L 45/1253* (2013.01); *H01L 45/085* (2013.01); *H01L 45/1233* (2013.01); *H01L 45/1266* (2013.01); *H01L 45/14* (2013.01); *H01L 45/145* (2013.01); *H01L 45/16* (2013.01); *G11C 11/5614* (2013.01)

(58) Field of Classification Search
CPC ... H01L 45/08; H01L 45/085; H01L 45/1266; G11C 11/56; G11C 2213/55
See application file for complete search history.

(56) References Cited

U.S. PATENT DOCUMENTS

| 2012/0127779 A1* | 5/2012 | Scheuerlein | ....... G11C 13/0007 365/148 |
| 2014/0284535 A1* | 9/2014 | Saitoh | ................ H01L 27/2481 257/2 |

* cited by examiner

*Primary Examiner* — John A Bodnar
(74) *Attorney, Agent, or Firm* — Wegman Hessler

(57) ABSTRACT

Providing for improved manufacturing of silver-based electrodes to facilitate formation of a robust metallic filament for a resistive switching device is disclosed herein. By way of example, a silver electrode can be embedded with a non-silver material to reduce surface energy of silver atoms of a silver-based conductive filament, increasing structural strength of the conductive filament within a resistive switching medium. In other embodiments, an electrode formed of a base material can include silver material to provide mobile particles for an adjacent resistive switching material. The silver material can drift or diffuse into the resistive switching material to form a structurally robust conductive filament therein.

19 Claims, 16 Drawing Sheets

SELECTOR LAYER FILAMENT BEHAVIOR FROM TOP ELECTRODE
600D
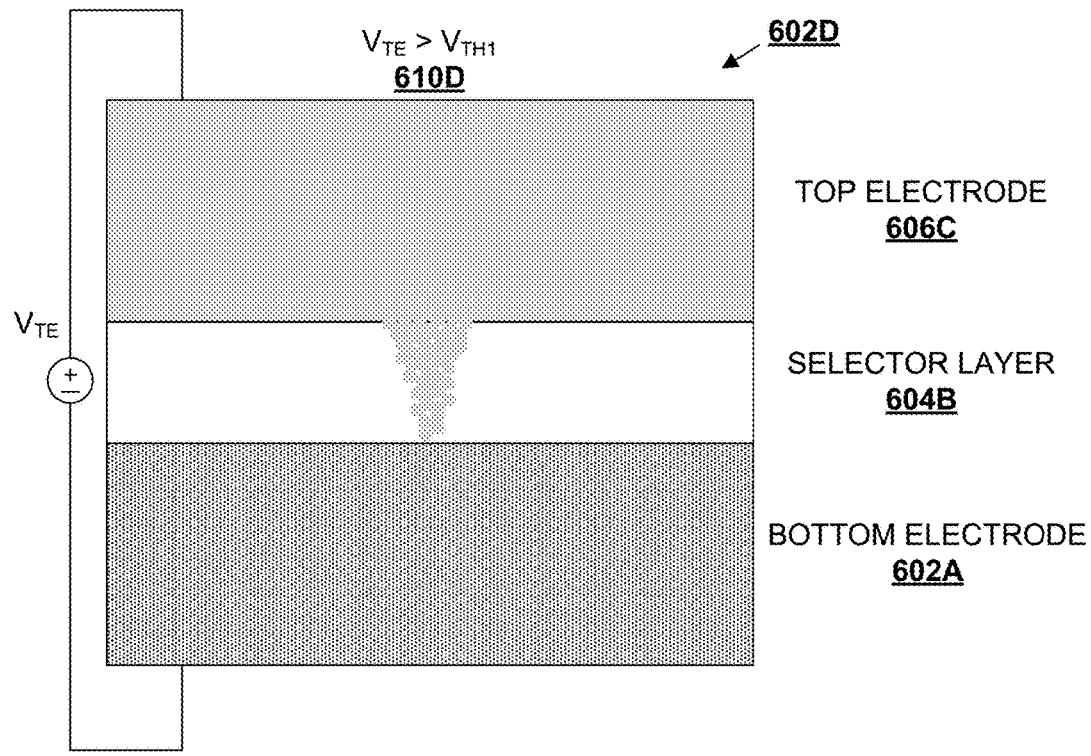
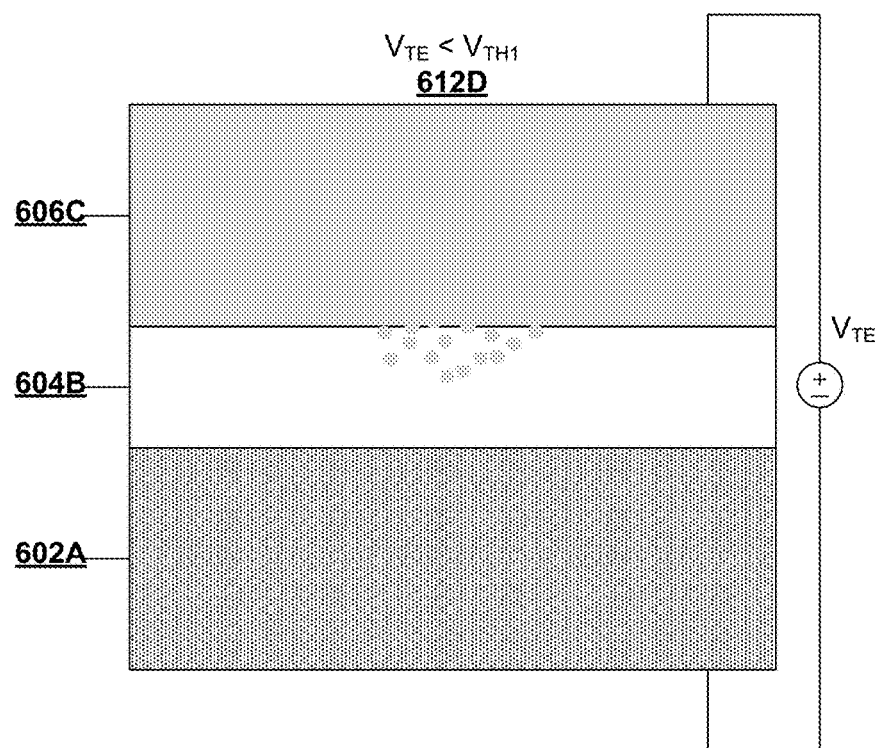
FIG. 6D

SELECTOR LAYER FILAMENT BEHAVIOR FROM BOTTOM ELECTRODE
600E
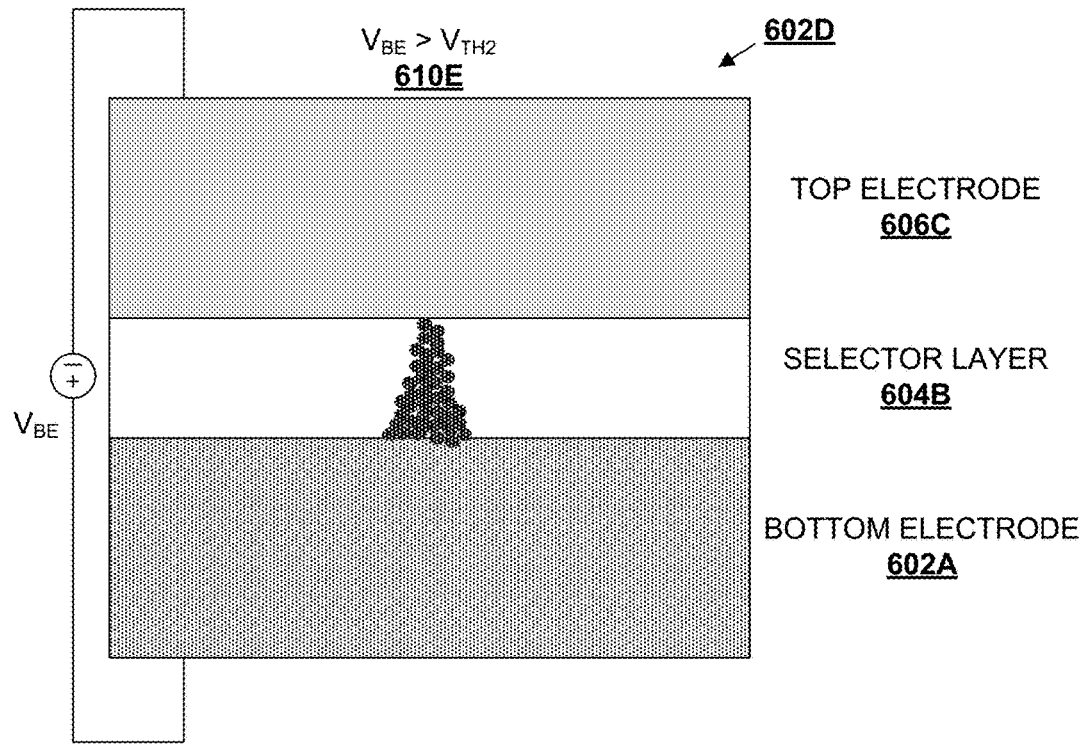
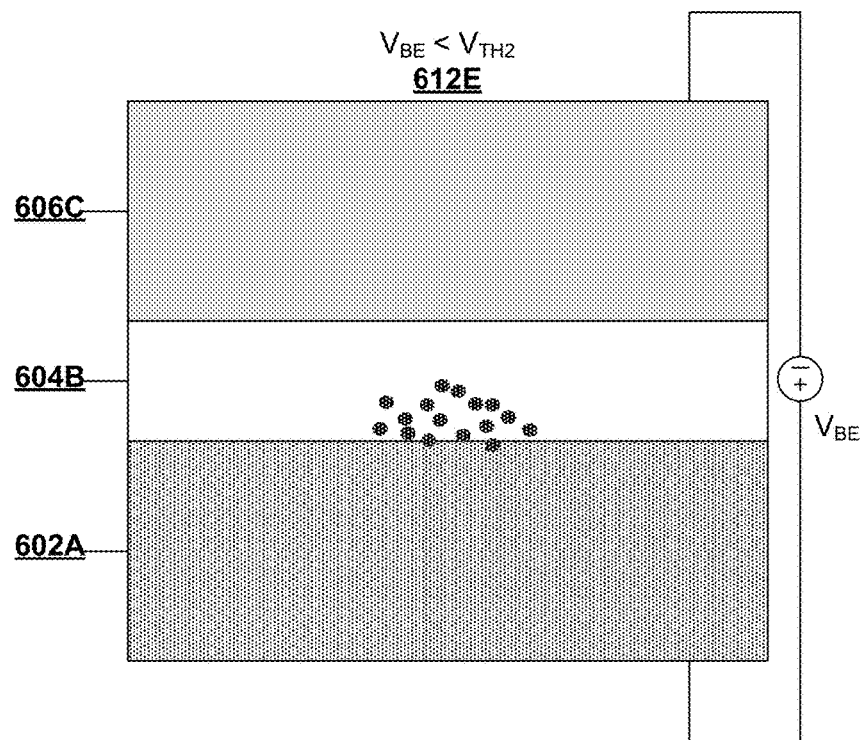
FIG. 6E

800 ⇢

```
┌─────────────────────────────────────────┐
│ FORM A FIRST METAL CONTAINING LAYER     │
│ CONFIGURED TO PROVIDE A FIRST PLURALITY │—802
│ OF METAL PARTICLES                      │
└─────────────────────────────────────────┘
                    │
                    ▼
┌─────────────────────────────────────────┐
│ FORM A SECOND METAL CONTAINING LAYER    │
│ OVERLYING THE FIRST METAL CONTAINING    │—804
│ LAYER AND CONFIGURED TO PROVIDE A       │
│ SECOND PLURALITY OF METAL PARTICLES     │
└─────────────────────────────────────────┘
                    │
                    ▼
┌─────────────────────────────────────────┐
│ FORM A SELECTOR MATERIAL LAYER DISPOSED │
│ BETWEEN OR IN CONTACT WITH THE FIRST    │
│ METAL CONTAINING LAYER AND THE SECOND   │
│ METAL CONTAINING LAYER, AND COMPRISING  │
│ A PLURALITY OF DEFECT REGIONS           │—806
│ CONFIGURED TO RECEIVE THE FIRST         │
│ PLURALITY OF METAL PARTICLES IN         │
│ RESPONSE TO A FIRST STIMULUS AND TO     │
│ RECEIVE THE SECOND PLURALITY OF METAL   │
│ PARTICLES IN RESPONSE TO A SECOND       │
│ STIMULUS OF OPPOSITE POLARITY TO THE    │
│ FIRST STIMULUS                          │
└─────────────────────────────────────────┘
```

FIG. 8

FORMATION OF STRUCTURALLY ROBUST NANOSCALE AG-BASED CONDUCTIVE STRUCTURE

CROSS REFERENCE TO RELATED APPLICATIONS

The present application for patent is a divisional application of and claims priority to U.S. patent application Ser. No. 15/185,256 filed Jun. 17, 2016 and claims the benefit of U.S. Provisional Patent Application Ser. No. 62/181,051 entitled: FORMATION OF STRUCTURALLY ROBUST NANOSCALE Ag-BASED CONDUCTIVE STRUCTURE, and filed Jun. 17, 2015, each of which is hereby incorporated by reference herein in its respective entirety and for all purposes.

TECHNICAL FIELD

This disclosure relates generally to electronic memory, for example, the disclosure describes formation of a silver-based electrode that facilitate formation of a durable conductive filament within a resistive switching device.

BACKGROUND

A recent innovation within the field of integrated circuit technology is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

Resistive random access memory (RRAM) is one example of resistive memory. The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode, insulator, electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In various embodiments of the present disclosure, improved manufacturing of silver-based electrodes is disclosed to facilitate formation of a robust metallic filament for a resistive switching device. In some embodiments, a silver electrode can be embedded with an additional material to reduce surface energy of silver atoms within a silver-based conductive filament. In various embodiments, about 0.1% to about 10% of additional material, by atomic %, can be added to a silver material to form a silver-alloy metal electrode. The additional materials can include, in various embodiments, semiconductor materials such as Si, Ge, Ga, As, and others. In still other embodiments, the additional materials can include a metal (e.g., Ti, Al, Cu, Pt, Pd, W, etc.), a metal nitride (e.g., TiN, WN, AlN, etc.), a metal oxide (e.g., AlOx, TiOx, CuOx, and so forth), or a suitable combination of the foregoing.

In additional embodiments, a base material can be provided with an atomic % of silver atoms, and the base material plus silver atoms can form a conductive electrode for a resistive switching device. Silver particles from the conductive electrode, in response to a diffusion or drift stimulus, can form a conductive filament within a suitable insulating layer (e.g., having defect sites or material voids which the silver atoms can occupy). In various embodiments, between about 1% and about 50% silver by atomic % can be provided to the base material. In various embodiments, the base material can be a metal, a semiconductor, or an oxide, or a suitable combination of the foregoing.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc.

In other instances, well-known structures and devices are shown in block diagram form to facilitate describing the subject disclosure;

FIG. 6D illustrates a block diagram of a sample selector device behavior in response to an electrical characteristic of a first polarity;

FIG. 6E depicts a block diagram of a sample selector device according to alternative or additional aspects of the present disclosure;

FIG. 8 depicts a flowchart of a sample method for forming a volatile resistive switching device having a silver-based contact, in further embodiments;

DETAILED DESCRIPTION

Figure 1:
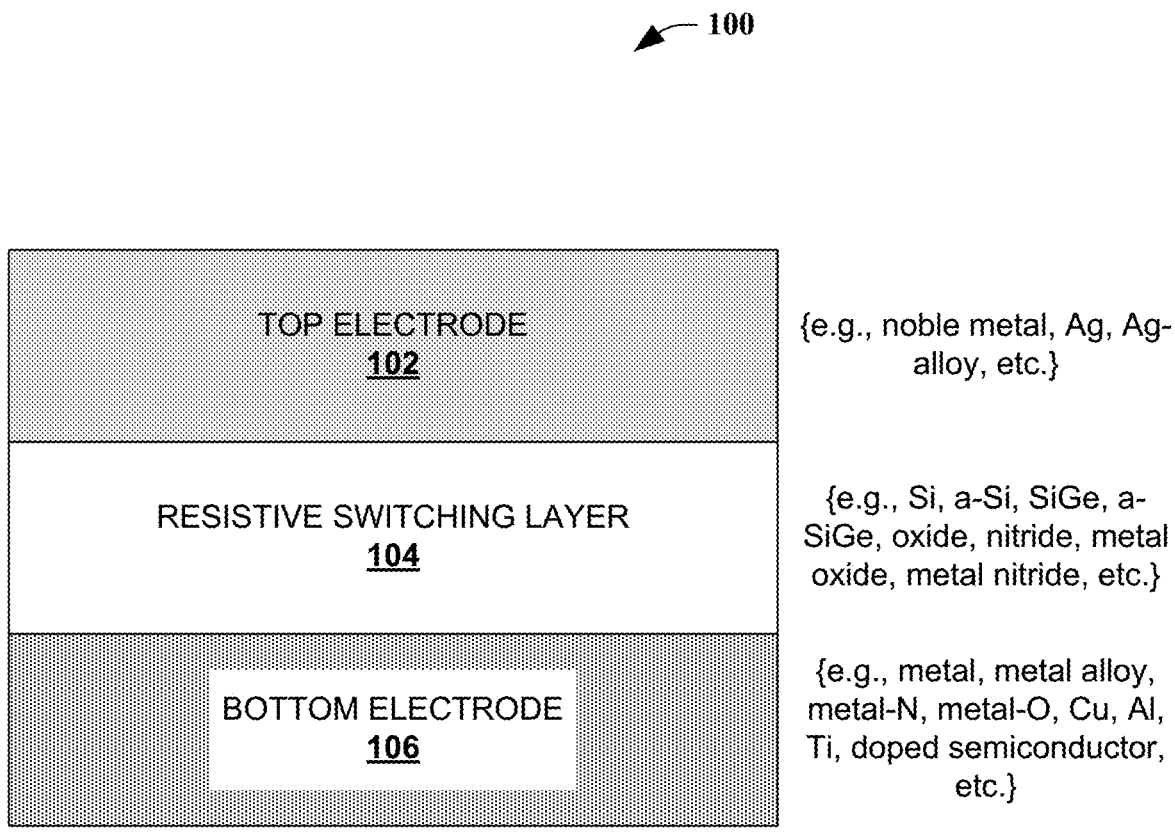
FIG. 1 illustrates a block diagram of an example monolithic memory structure according to various disclosed embodiments.

This disclosure relates to a conductive contact that facilitates provision of an improved silver-based nanoscale filament for a resistive switching device. In some embodiments, the resistive switching device can be a non-volatile memory device. In other embodiments, the resistive switching device can be a volatile switching device. In other embodiments, a resistive switching non-volatile memory cell can comprise a non-volatile memory device comprising a first embodiment of the conductive contact, in electrical series with the volatile switching device comprising a second embodiment of the conductive contact. In some aspects of the present disclosure, the first embodiment of the conductive contact can be the same or similar to the second embodiment of the conductive contact; in other aspects, the first embodiment of the conductive contact can be different from the second embodiment of the conductive contact.

One or more embodiments of the subject disclosure include filamentary-based memory cells. In some embodiments, the filamentary-based memory cell includes a non-volatile memory device, whereas other embodiments provide a volatile selector device (e.g., in electrical series with the non-volatile memory device). In further embodiments, both the volatile selector device and the non-volatile memory device can be filamentary-based devices (e.g., included as components of a filamentary-based memory cell), though the subject disclosure is not limited to these embodiments.

One example of a filamentary-based device can comprise: a conductive layer, a resistive switching layer (RSL) and an active metal capable of being ionized. Under suitable conditions, the active metal layer can provide filament forming ions to the RSL. In such embodiments, a conductive filament (e.g., formed at least in part by the ions) can facilitate electrical conductivity through at least a subset of the RSL, and a resistance of the filament-based device can be determined by a tunneling resistance (or, e.g., ohmic contact resistance) between the filament and the conductive layer. To reverse electrical conductivity resulting from the conductive filament, whether for the volatile selector device or the non-volatile memory device (with the exception of one-time programmable memory devices), the filament can be deformed. In some embodiments, deformation of the filament can comprise the particles (e.g., metal ions) becoming neutral particles (e.g., metal atoms) in absence of the bias condition that have a high electrical resistance. In other embodiments, deformation of the filament can comprise dispersion (or partial dispersion) of the particles within the RSL, breaking a conductive electrical path provided by the filament in response to the bias condition. In still other embodiments, deformation of the filament can be in response to another suitable physical mechanism, or a suitable combination of the foregoing.

According to various theoretical models, an RSL can be characterized in part as a function of particle-trapping defect locations within a material of the RSL. These defect locations can be structural voids, dangling bonds, lattice vacancies, or the like, within which particles of another material can become physically bound (e.g., under a suitable condition(s), such as a low driving stimulus). Conductive particles (or particles that can be ionized) trapped within defect locations of sufficient spacing and number can result in electrical continuity between the conductive particles within an otherwise electrically insulating material.

Generally, deformation of a conductive filament results from a change in the bias conditions to a second set of bias conditions. The second set of bias conditions can vary for different devices. For instance, deformation of a conductive filament formed within the volatile selector device can be implemented by reducing an applied bias below a formation magnitude (or small range of magnitudes, such as a few tenths of a volt) associated with filament formation within the volatile selector device. Depending on the embodiment, a conductive filament can be created within a volatile selector device in response to a positive bias (e.g., forward bias) or in response to a negative bias (e.g., reverse bias), and deformation of the filament can occur in response to a suitable lower-magnitude positive bias or a suitable lower-magnitude negative bias, respectively. See U.S. patent application Ser. No. 14/588,185 filed Dec. 31, 2014 commonly owned by the assignee of the present application, and hereby incorporated by reference herein in its entirety and for all purposes. In contrast, deformation of a conductive filament formed within the non-volatile memory device can be implemented by providing a suitable erase bias (e.g., a reverse bias), having opposite polarity from a program bias (e.g., forward bias) utilized to form the conductive filament within the non-volatile memory device.

The conductive layer of the filamentary-based device can be a bottom electrode in some embodiments, and can comprise e.g., a metal, a conductive metal compound (e.g., TiN, TaN, TiW, etc.), a doped silicon (Si) bearing layer (e.g., p-type or n-type polysilicon, p-type or n-type polycrystalline SiGe, and so forth). The conductive layer is not limited to any vertical or spatial orientation however, and though by example is referenced above as a bottom electrode, in other embodiments the conductive layer can simply be a first electrode having any suitable spatial orientation relative to other components of the filamentary-based device. In various embodiments, the conductive layer can comprise TiN, TaN, or W, among other suitable electrically conductive materials selected, for instance, for compatibility with a fabrication process or a set of fabrication constraints (e.g., thermal budget, metallization scheme, photolithographic toolset, etching chemistry, etc.).

The RSL (which can also be referred to in the art as a resistive switching media (RSM)) can comprise, for example, an undoped amorphous Si layer, a semiconductor layer having intrinsic characteristics, a silicon nitride (e.g., SiN, $Si_3N_4$, $SiN_x$, etc.), a Si sub-oxide (e.g., $SiO_x$ wherein x has a value between 0.1 and 2), a Si sub-nitride, a non-stoichiometric oxide, a non-stoichiometric nitride, a metallic oxide (e.g. Zinc Oxide, among others), a metallic nitride (e.g., AlN, etc.) and so forth. Other examples of materials suitable for an RSL, depending on the embodiment, could include $Si_XGe_YO_Z$ (where X, Y, and Z are respective suitable positive integers), a silicon oxide (e.g., $SiO_N$, where N is a suitable positive integer), amorphous Si (a-Si), amorphous SiGe (a-SiGe), TaOB (where B is a suitable positive integer), $HfO_C$ (where C is a suitable positive integer), $TiO_D$ (where D is a suitable positive integer), AWE (where E is a suitable positive number), and so forth, or a suitable combination thereof. For a volatile selector device, the RSL can be configured to have few or no voids or defects that could trap or hold particles (e.g., particles of the active metal layer). Accordingly, the RSL of the selector device can require maintenance of an external stimulus to keep a conductive filament in place. For the non-volatile memory device, the RSL can be configured to have suitable concentration(s) (or concentration gradient(s)) of voids or defects to trap or hold particles in place, in the absence of an external program stimulus causing the particles to drift within the RSL, and form the conductive filament. For the non-volatile memory device then, the particles can remain trapped in the absence of the external program stimulus, requiring a suitable reverse bias (e.g., a negative polarity erase stimulus) to drive the particles out of the voids/defects, or otherwise break continuity of the conductive filament, thereby deforming the conductive filament.

In some embodiments, a contact material layer can be disposed between the conductive layer and the RSL. The contact material layer can be comprised of any suitable conductor, such as a conductive metal, a suitably doped semiconductor, or the like. Where utilized, the contact material layer can be employed to provide good ohmic contact between the RSL and a metal wiring layer (e.g., the conductive layer, if coincident with the metal wiring layer) of an associated memory architecture. In some embodiments, the contact material layer can be removed and the RSL can be in physical contact with the metal wiring layer/conductive layer. Suitable metal wiring layers can include copper, aluminum, tungsten, platinum, gold, silver, or other suitable metals, suitable metal alloys, metal compounds, or combinations of the foregoing. In at least one embodiment, the metal wiring layer can instead be a conductive Si wiring layer (rather than metal). In further embodiments, a diffusion mitigation layer or adhesion layer can be provided between the RSL and the metal wiring layer (or between the RSL and the contact material layer).

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials (e.g., conductive metal oxide, conductive metal nitride, etc.) can be employed for the active metal layer in some aspects of the subject disclosure. In some embodiments, a thin layer of barrier material composed of Ti, TiN, or the like, may be disposed between the RSL and the active metal layer (e.g., Ag, Al, $AlN_y$, where y is a suitable positive integer, and so on). Details pertaining to additional embodiments of the subject disclosure similar to the foregoing example(s) can be found in the following U.S. patent applications that are licensed to the assignee of the present application for patent: application Ser. No. 11/875,541 filed Oct. 19, 2007, application Ser. No. 12/575,921 filed Oct. 8, 2009, and the others cited herein, each of which are incorporated by reference herein in their respective entireties and for all purposes.

In some embodiments, and by way of example, a disclosed filamentary-based selector device can form a conductive path or filament through a relatively high resistive portion in response to a suitable external stimulus. The external stimulus can cause metallic particles (e.g., Ag particles, Ag-alloy particles, etc.) within an active metal layer to migrate within (or ionize within) a RSL layer of the filamentary selector device. Further, the RSL can be selected to have relatively few physical defect locations for the volatile filamentary switching device, facilitating relatively good mobility of the metallic particles and formation of a very narrow conductive filament within the RSL (e.g., a filament having a width of only one or a few atoms, and a length that extends through the thickness of the RSL, or most of the thickness of the RSL). Accordingly, below an associated threshold stimulus (or narrow range of threshold values), the metallic particles can be dispersed within the RSL to prevent formation of a sufficient conductive path through the RSL to lower a high resistance associated with the first state. The dispersion or deformation of the conductive path can result from particle mobility or the small width dimension of the very narrow conductive filament, or the like, or a suitable combination of the foregoing. Above the threshold, the external stimulus maintains the metallic particles in sufficient formation to provide the conductive path, leading to relatively low resistance of the second state. An analogous mechanism can control operation of the third state in the bipolar context.

For a non-volatile filamentary-based resistive switching memory cell, an RSL can be selected to have sufficient physical defect sites therein so as to trap particles in place in the absence of a suitable external stimulus, mitigating particle mobility and dispersion. With the sufficient physical defect sites, and in response to a suitable program voltage applied across the memory cell, a conductive path or a filament forms through the RSL. In particular, upon application of a programming bias voltage, metallic ions are generated from the active metal layer and migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

Referring now to the drawings, FIG. 1 illustrates a block diagram of an example resistive switching device 100, in one or more embodiments of the present disclosure. In an embodiment, resistive switching device 100 can be a non-volatile resistive memory. In another embodiment, resistive switching device 100 can be a volatile resistive switching selector device.

Resistive switching device 100 can comprise a top electrode 102, a resistive switching layer 104 and a bottom electrode 106. In some embodiments, resistive switching device 100 can comprise one or more additional layers (e.g., an adhesion layer(s), a contact layer(s), a barrier layer(s), a diffusion-mitigation layer(s), or the like, or a suitable combination thereof) not specifically depicted therein. Top electrode 102 can comprise a noble metal, Ag, a Ag-alloy, an alloy containing Ag, or the like. Resistive switching layer 104 can comprise a programmable or reversibly programmable multi-resistance layer. Examples can include a Si, an amorphous Si, a metal-oxide, a metal-nitride, or the like. Resistive switching layer 104 can comprise defects or material gaps/voids within resistive switching layer 104 within which particles of top electrode 102 can diffuse or drift (e.g., in response to an external stimulus). In some embodiments, resistive switching layer 104 can be selected to have a high density of the defects or material gaps/voids, to facilitate formation of a very wide, thick conductive filament comprising many of the particles of top electrode 102 (e.g., a non-volatile conductive filament). In other embodiments, resistive switching layer 104 can be selected to have a very low density of the defects or material gaps/voids, to facilitate formation of a very narrow conductive filament of the particles of top electrode 102, which can easily deform in response to an external stimulus dropping below a threshold magnitude (e.g., a volatile conductive filament).

In various embodiments, bottom electrode 106 can be a conductive electrode. In some embodiments, bottom electrode 106 can be selected to have a moderate electrical resistance (e.g., a few hundred ohms, or a few kilohms). Bottom electrode 106 with the moderate electrical resistance can be suitable for a non-volatile resistive switching device, in some embodiments, to provide intrinsic current control in one or more embodiments. In other embodiments, bottom electrode 106 can be selected to have a very small electrical resistance (e.g., a few ohms or tens of ohms, or less). Bottom electrode 106 with the very small electrical resistance can be suitable for a volatile resistive switching device, in other embodiments, to facilitate very rapid formation of a conductive filament, quickly saturating a current compliance provided for activating a volatile selector device, and mitigating or avoiding thickening of the volatile conductive filament. In such embodiments, bottom electrode 106 can facilitate a reliable formation/deformation of the volatile conductive filament in response to a stimulus meeting a threshold stimulus magnitude (or range of magnitudes), or dropping below the threshold stimulus magnitude (or range of magnitudes).

In one or more additional embodiments, top electrode 102 can comprise a Ag material with an alloy material. The alloy material can comprise a semiconductor (Si, Ge, Ga, As, and others), a metal (e.g., Ti, Al, Cu, Pt, Pd, W, etc.), a metal nitride (e.g., TiN, WN, AlN, and so on), a metal oxide (e.g., AlOx, TiOx, CuOx, etc.), or the like, or a suitable combination of the foregoing. In various embodiments, top electrode 102 can comprise between about 0.1% and about 10% of the alloy material, and a remainder metallic Ag by atomic %.

In alternative embodiments, top electrode 102 can comprise a base material having an atomic % of Ag material. In various embodiments, the base material can comprise a semiconductor (Si, Ge, Ga, As, and others), a metal (e.g., Ti, Al, Cu, Pt, Pd, W, etc.), a metal nitride (e.g., TiN, WN, AlN, and so on), a metal oxide (e.g., AlOx, TiOx, CuOx, etc.), or the like, or a suitable combination of the foregoing. Further, the atomic % of Ag material can be selected from a range of about 1% and about 50%, in some embodiments.

Figure 2:
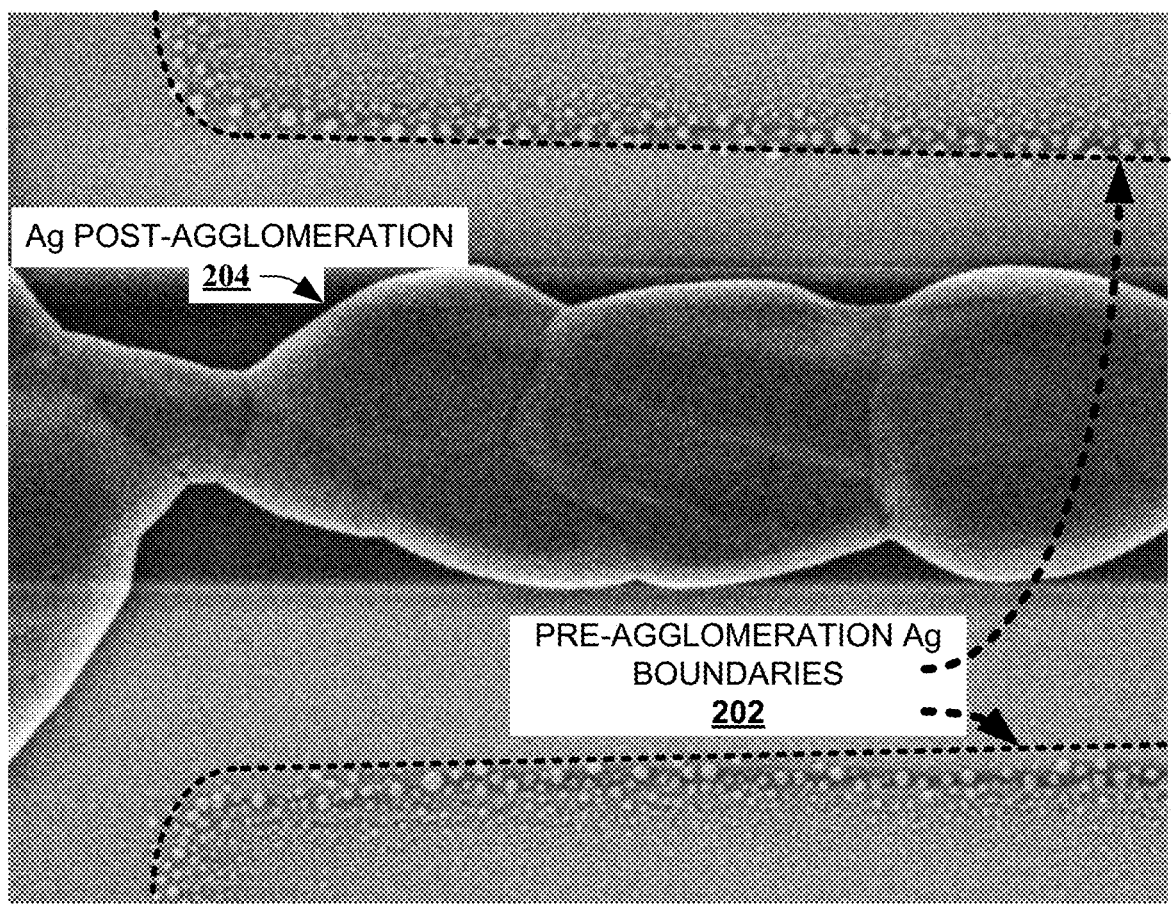
FIG. 2 provides a graphical illustration of agglomerated silver atoms in a nanoscale silver structure, according to disclosed embodiments.

FIG. 2 depicts a graphic of an agglomeration/re-crystallization of Ag metal (agglomerated Ag 200), according to various embodiments. Agglomerated Ag 200 can be a steady-state Ag structure, previously formed within (and substantially filling) pre-agglomeration Ag boundaries 202, as illustrated by the upper and lower dotted lines. As the Ag metal agglomerates or re-crystallizes (at about 200 degrees Celsius, for the structure depicted by FIG. 2), the Ag metal becomes more dense and occupies less volume, retracting from the pre-agglomeration Ag boundaries 202. This reduction in volume of post-agglomeration Ag 204 can detrimentally affect a nanoscale structure utilizing silver for a resistive switching device. Embodiments of the present disclosure provide for a more robust Ag-based filament.

Figure 3:
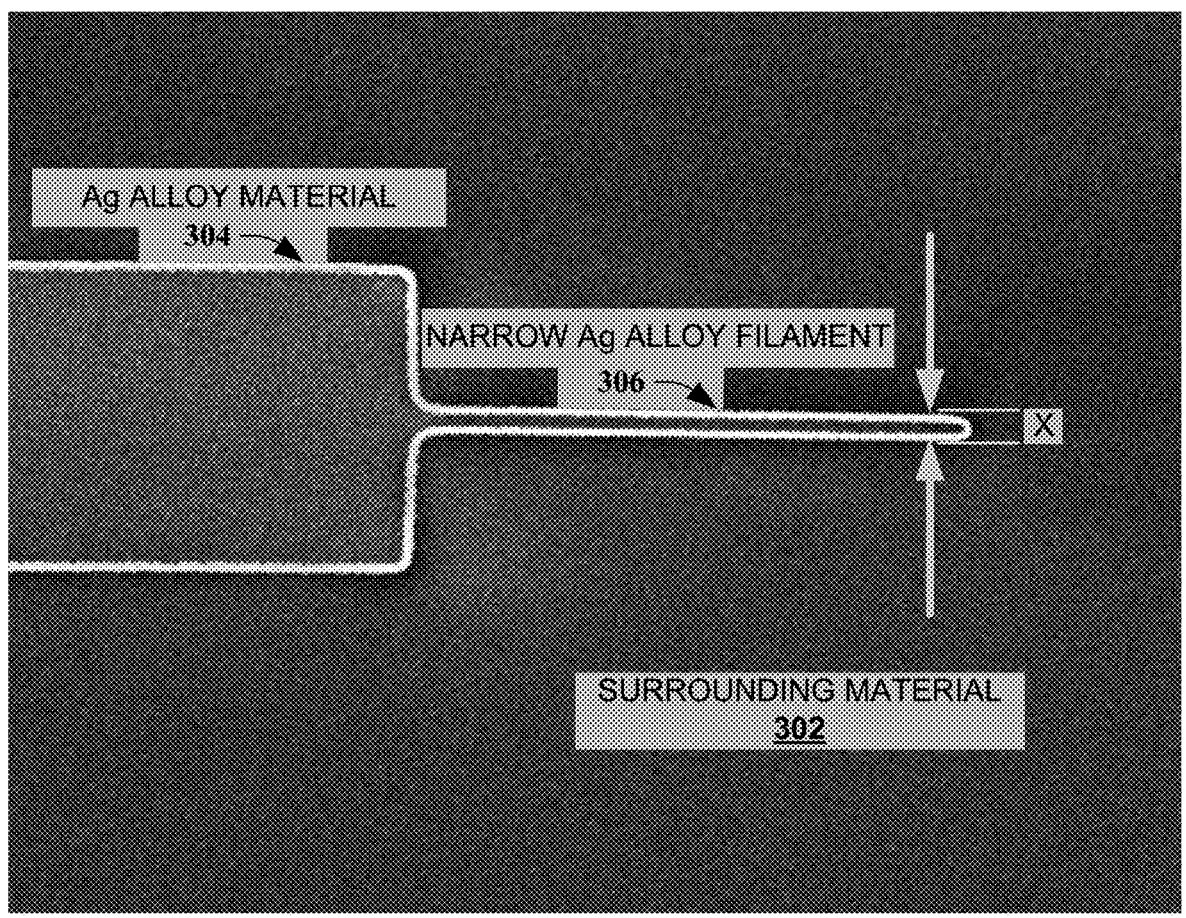
FIG. 3 provides a graphical illustration of a robust silver-based nanoscale filament in a resistive switching medium, according to further embodiments.

FIG. 3 depicts a graphic of a robust Ag-based filament structure 300 according to a first embodiment of the present disclosure. Robust Ag-based filament structure 300 is a steady-state construct, which substantially retains a shape or volume of a narrow Ag alloy filament 306 (e.g., formed in response to an external stimulus causing Ag alloy particles to drift within surrounding material 302). Ag alloy material 304 can comprise Ag metal and about 1% to about 10% (by atomic %) of a semiconductor, metal, metal oxide or metal nitride, according to various embodiments.

Figure 4:
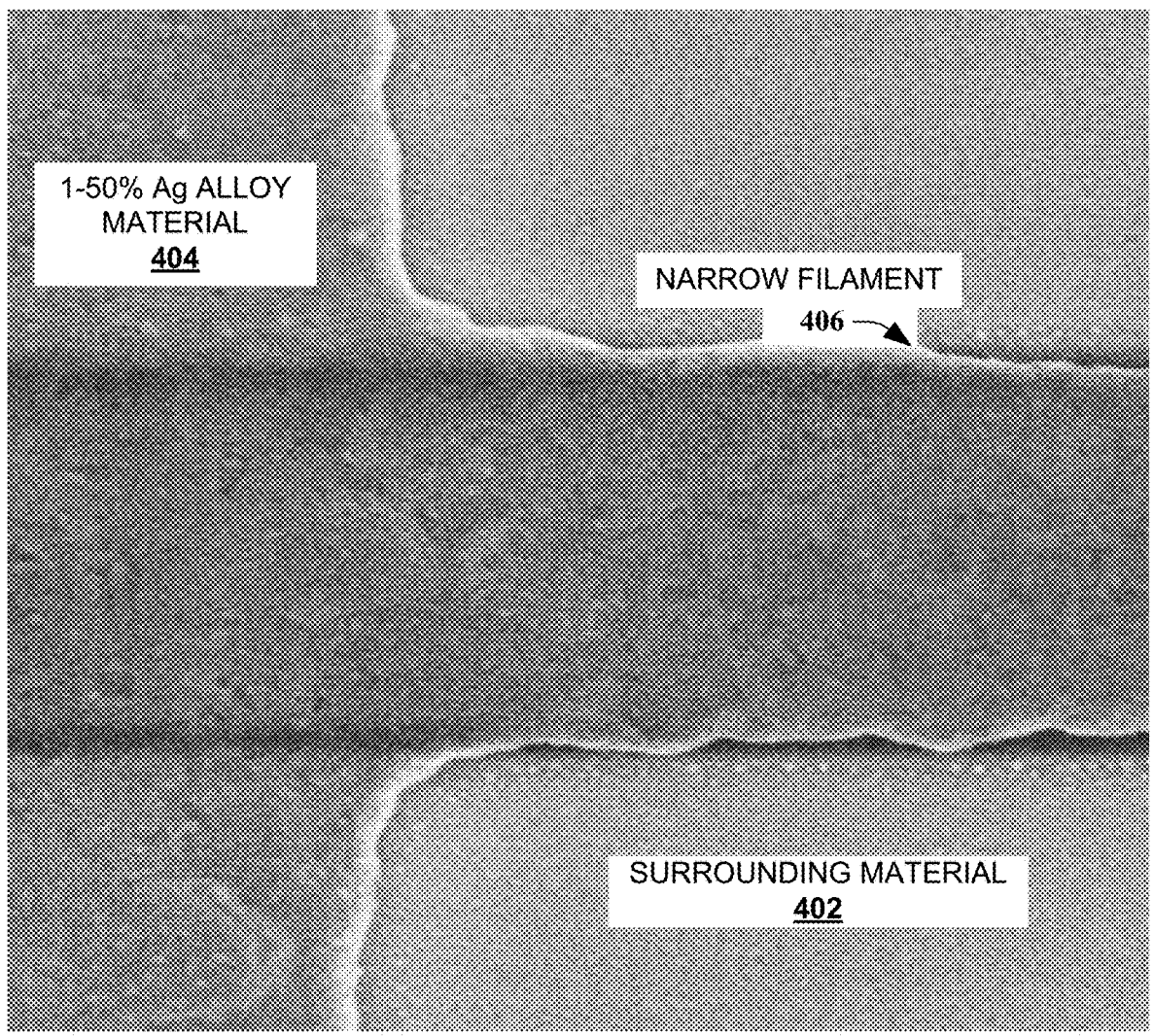
FIG. 4 provides a graphical illustration of a robust silver-based nanoscale filament in a resistive switching medium, in an alternative embodiment.

FIG. 4 illustrates a graphic of a robust Ag-based filament structure 400 according to a second embodiment of the present disclosure. Robust Ag-based filament structure 400 is a steady-state construct, which substantially retains a shape or volume of a narrow filament 406 (e.g., formed in response to an external stimulus causing Ag alloy material to drift within surrounding material 402). Ag alloy material 404 can comprise a base material (e.g., a semiconductor, a metal, a metal oxide, a metal nitride, and so on), including silver particles within a range of about 1% to about 50% by atomic % silver particles.

FIGS. 5A, 5B, 5C and 5D depict diagrams of an example fabrication of a memory device 500 according to one or more embodiments. Memory device 500 can be a non-volatile resistive switching memory device in at least one embodiment. Further, the non-volatile resistive switching memory device can be characterized by a reversibly programmable Ag alloy filament formed through a resistive portion of memory device 500. In one or more embodiments, memory device 500 can be formed overlying a substrate comprising one or more CMOS devices formed in the substrate, and within a thermal budget of the CMOS devices.

Figure 5A:
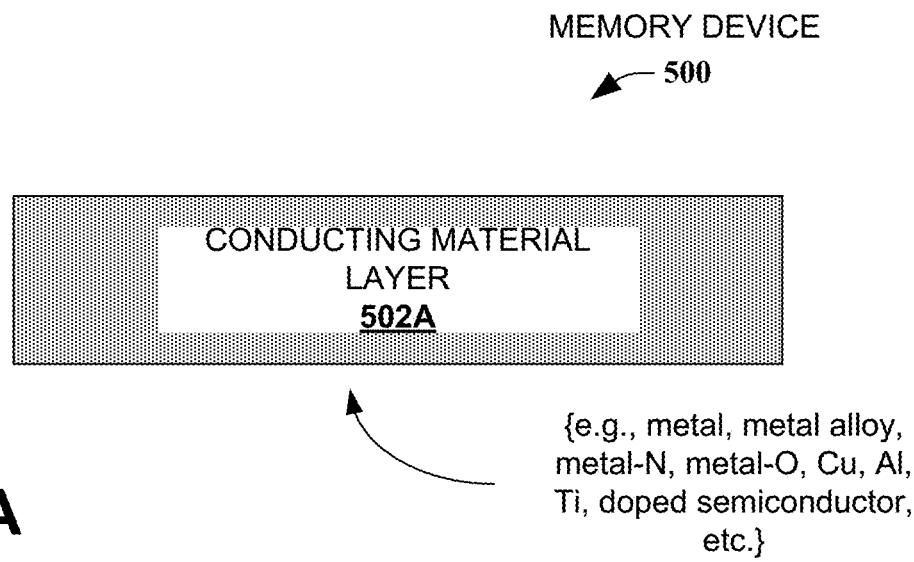
FIGS. 5A, 5B, 5C and 5D depict block diagrams of example stages of formation for a non-volatile resistive switching device, in an embodiment.

Referring first to FIG. 5A, a conducting material layer 502A can be deposited. Conducting material layer 502A can comprise a suitable electrical conducting material. Examples of the suitable electrical conducting material can include a metal, a metal alloy, a metal nitride (e.g., AlN, etc.), a metal oxide, Cu, Al, Ti, a doped semiconductor, or other suitable electrical conductor, or a suitable combination of the foregoing. Although not depicted, conducting material layer 502A can be formed overlying a substrate, optionally with one or more intervening layers between the substrate and conducting material layer 502A (e.g., including one or more oxide layers, one or more dielectric layers, one or more front-end-of-line layers, one or more back-end-of-line layers, and so forth).

Figure 5B:
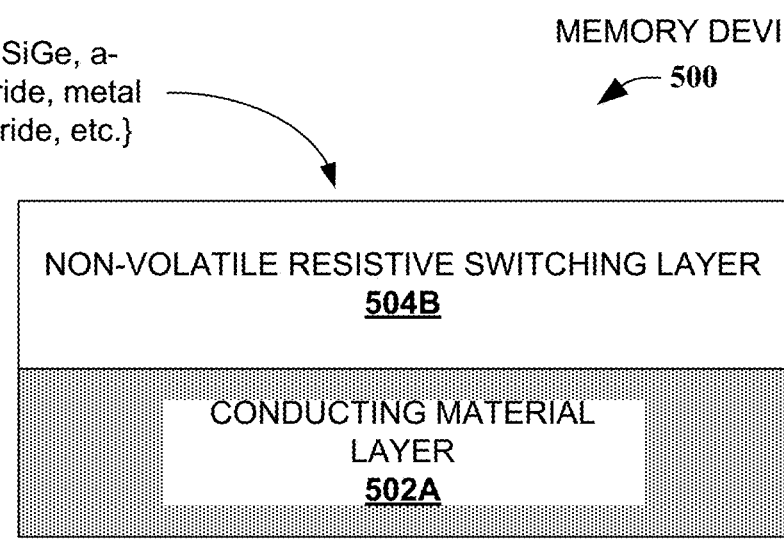

FIG. 5B depicts a non-volatile resistive switching layer 504B overlying conducting material layer 502A. Non-volatile resistive switching layer 504B can comprise an electrically resistive material, comprising or formed to comprise material voids or defects therein. Example materials for non-volatile resistive switching layer 504B can include Si, a-Si, SiGe, a-SiGe, oxide, nitride, metal oxide, metal nitride, and so forth.

Figure 5C:
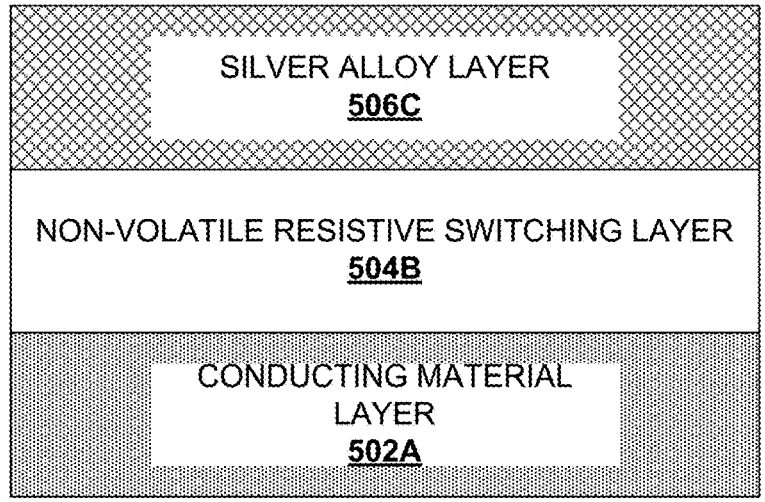

FIG. 5C depicts a silver alloy layer 506C formed overlying non-volatile resistive switching layer 504B. Silver alloy layer 506C can be selected to provide stable filament within non-volatile resistive switching layer 504B. The stable filament can, for example, occupy a subset of the material voids or defects in non-volatile resistive switching layer 504B. In an embodiment, silver alloy layer 506C can comprise about 90% to about 99.9% Ag by atomic weight and between about 10% and about 0.1% additional material(s) by atomic weight. Examples of suitable additional material(s) can include a semiconductor (Si, Ge, Ga, As, and others), a metal (e.g., Ti, Al, Cu, Pt, Pd, W, etc.), a metal nitride (e.g., TiN, WN, AlN, and so on), a metal oxide (e.g., AlOx, TiOx, CuOx, etc.), or the like, or a suitable combination of the foregoing. In another embodiment, silver alloy layer 506C can comprise about 50% to about 99% atomic weight of a first material(s), and about 1% to about 50% atomic weight of Ag. In the latter embodiment, the first material(s) can comprise a semiconductor (Si, Ge, Ga, As, and others), a metal (e.g., Ti, Al, Cu, Pt, Pd, W, etc.), a metal nitride (e.g., TiN, WN, AlN, and so on), a metal oxide (e.g., AlOx, TiOx, CuOx, etc.), or the like, or a suitable combination of the foregoing.

Figure 5D:
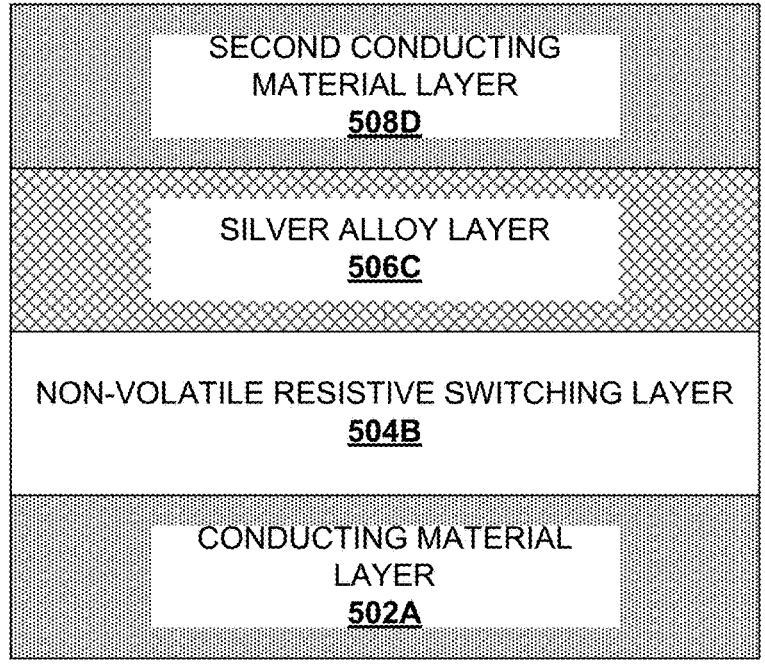

FIG. 5D depicts a second conducting material layer 508D formed overlying silver alloy layer 506C. Second conducting material layer 508D can comprise an electrically conductive material. Suitable examples can include a metal, a metal alloy, a metal nitride (e.g., AlN, etc.), a metal oxide, Cu, Al, Ti, a doped semiconductor, or other suitable electrical conductor, or a suitable combination of the foregoing.

Figures 6A, 6B:
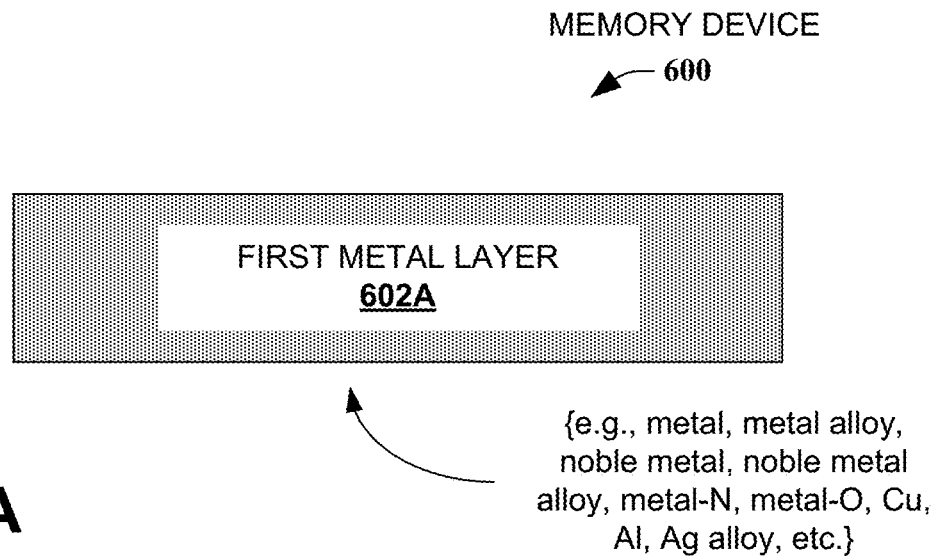
FIGS. 6A, 6B and 6C illustrate block diagrams of sample stages of formation for a volatile resistive switching device, in another embodiment.
Figure 6C:
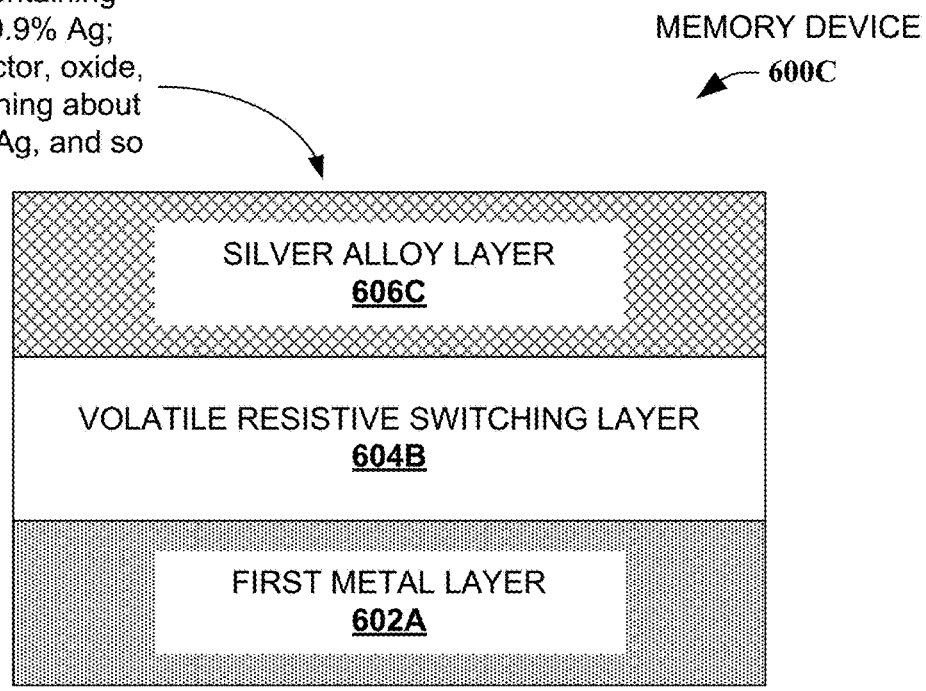
Figure 6F:
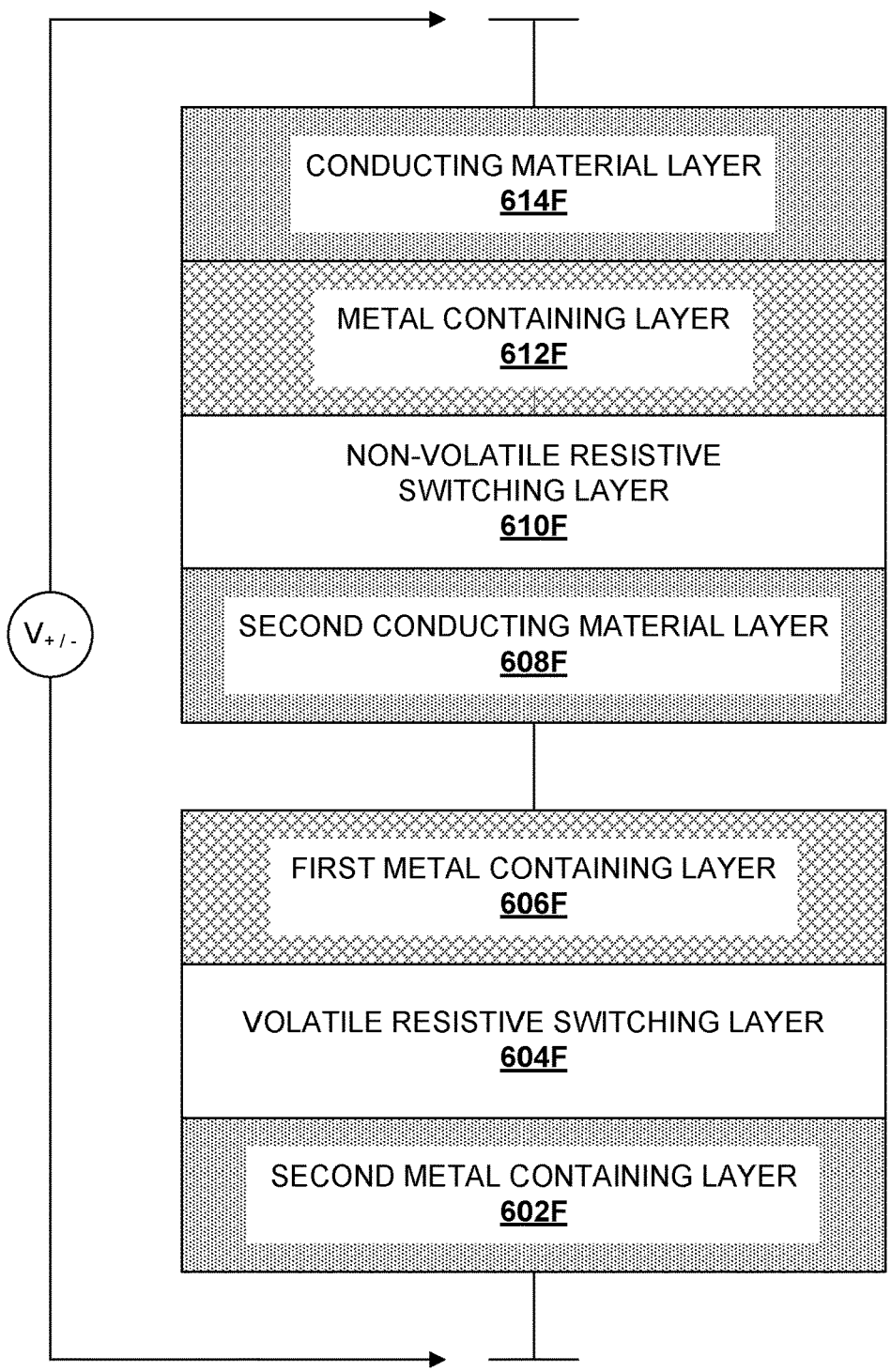
FIG. 6F depicts a block diagram of an example electric series combination of a selector device and a non-volatile resistive switching device, in an embodiment.

FIGS. 6A, 6B, and 6C depict diagrams of an example fabrication of a memory device 600 according to one or more embodiments. Memory device 600 can be a volatile selector device in at least one embodiment. Further, the volatile selector device can be characterized by an unstable Ag alloy filament formed through a resistive portion of memory device 600 that maintains electrical continuity in response to continuous application of an external voltage. In one or more embodiments, memory device 600 can be formed overlying a substrate comprising one or more CMOS devices formed in the substrate, and within a thermal budget of the CMOS devices.

Referring first to FIG. 6A, a first metal layer 602A can be deposited. First metal layer can include a metal, a metal alloy, a noble metal, a noble metal alloy, a metal nitride, a metal oxide, Cu, Al, Ag alloy, etc. In some embodiments, first metal layer can be selected to be able to provide a first set of metal particles for the volatile selector device in response to a voltage of a first polarity.

FIG. 6B depicts a volatile resistive switching layer 604B formed overlying first metal layer 602A. Volatile resistive switching layer 604B can be an electrically resistive material. Suitable examples can include Si, a-Si, SiGe, a-SiGe, an oxide, a nitride, a metal oxide, a metal nitride, and so forth. Further, volatile resistive switching layer 604B can be configured to receive the first set of metal particles in response to the voltage of the first polarity, which can form a (unstable) filament through volatile resistive switching layer 604B.

FIG. 6C depicts a silver alloy layer 606C formed overlying volatile resistive switching layer 604B. Silver alloy layer 606C can comprise a Ag alloy containing about 90% to about 99.9% Ag, or can contain a base material comprising about 99% to about 50% by atomic weight of the base metal, and containing about 1% to about 50% Ag metal. Additionally, silver alloy layer 606C can be configured to provide a second set of metal particles for the volatile selector device in response to a second voltage of a second polarity. Volatile resistive switching layer 604B can additionally be configured to receive the second set of metal particles, which can form a second unstable filament in volatile resistive switching layer 604B in response to the second voltage being maintained at a suitable magnitude.

FIG. 6D illustrates a block diagram depicting operational behavior 600D of a selector device 602D in response to applied signals, according to additional embodiments of the present disclosure. For instance, selector device 602D comprises a top electrode 606C, selector layer 604B and bottom electrode 602A, as depicted. In at least some embodiments, selector device 602D can be substantially similar to any selector device described herein, although the subject disclosure is not so limited.

At the top of FIG. 6D, selector device 602D is illustrated with a first signal 610D applied to selector device 602D. First signal 610D is greater than a threshold magnitude associated with non-linear I-V response of selector device 602D. In various embodiments, the threshold magnitude may be embodied as a narrow range of threshold magnitudes (e.g., see below). It should be appreciated that reference herein to a threshold magnitude (e.g., voltage magnitude) associated with a non-linear I-V response of a selector device could include a narrow range of threshold magnitudes (e.g., a range of voltage values) over which an I-V response transitions from linear (or approximately linear) behavior, to non-linear behavior. The range of magnitudes can vary as suitable for different sets of materials, arrangement of such materials, characteristics of such materials (e.g., thickness, area, conductivity, etc.), or the like, selected for components of the selector device.

Although first signal 610D is depicted as a voltage, e.g., where top electrode voltage $V_{TE}$ is greater than a first threshold voltage $V_{TH1}$ of selector device 602D, in other embodiments first signal 610D can comprise other signals inducing particle mobility of particles of top electrode 606C or bottom electrode 602A, such as an electric field, a current, or even a temperature associated with joule heating. In addition to the foregoing, first signal 610D can be of a first polarity (e.g., at least in the electrical sense). For instance, first signal 610D can have a positive gradient applied from top electrode 606C to bottom electrode 602A (e.g., a positive voltage or field at top electrode 606C and ground or negative voltage or field at 602A, current flow from top electrode 606C to bottom electrode 602A, and so forth).

In response to first signal 610D (top electrode 606C relative to bottom electrode 602A), particles of top electrode 606C (or bottom electrode 602A) can form a conductive path(s), or filament(s), within selector layer 604B as depicted. In some embodiments, the particles can migrate into selector layer 604B from top electrode 606C (or bottom electrode 602A) in response to first signal 610D. In other embodiments—for instance where selector layer 604B is doped with metallic particles—particles within selector layer 604B can be ionized or aligned (e.g., spatially organized along the conductive path(s)) in response to first signal 610D. In still other embodiments, particles can migrate from top electrode 606C (or bottom electrode 602A) in combination with existing particles within selector layer 604B being ionized and aligned in response to first signal 610D, to form the conductive path(s) if the selector layer is doped with metal particles. Formation of the conductive path(s) can facilitate transition from a non-conductive state to a conductive state, associated with non-linear I-V response of selector device 602D. Moreover, suitable formation of the conductive path(s) can be in response to a magnitude of first signal 610D meeting or exceeding a first threshold magnitude. Thus, the first threshold magnitude is associated with causing the transition to the conductive state.

At the bottom of FIG. 6D, selector device 602D observes a second signal 612D applied to top electrode 606C (relative to bottom electrode 602A). Second signal 612D can have a magnitude less than the first threshold magnitude (e.g., $V_{TE} < V_{TH1}$ e.g. $V_{TE} \approx 0V$), and in response selector device 602D can transition from the (highly) conductive state to the (relatively) non-conductive state. Again, in various embodiments, the first threshold magnitude may span a narrow range of magnitudes. A conductive path(s) formed in response to first signal 610D can dissipate, at least in part, in response to second signal 612D, as depicted within selector layer 604B in the bottom of FIG. 6D, or in response to removal of the first signal 610D. Dissipation can occur as a result of particle tendency to migrate within or out of selector layer 604B, when an external force (e.g., second signal 612D) is of insufficient strength to hold the particles in the conductive path(s) through selector layer 604B, from top electrode 606C through bottom electrode 602A. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 602D. To reiterate the above, in various embodiments herein, it should be understood that reference to a threshold voltage may actually refer to a set of threshold voltages (e.g., within a narrow range of voltages) associated with formation and deformation of a conductive path.

As described above, selector device 602D can transition from the non-conductive state to the conductive state, and back to the non-conductive state, in a volatile manner. In other words, selector device 602D can be in the conductive state in response to the first signal 610D having the first threshold magnitude being applied to selector device 200. Selector device 602D can be in the non-conductive state in response to the second signal 612D having less than the first threshold magnitude being applied to the selector device 602D.

In some embodiments, selector device 602D can be combined in electrical series with a two-terminal memory cell (e.g., a resistive switching memory, etc.). Selector device 602D can provide a non-linear I-V characteristic for a two-terminal memory cell when provided in series therewith. Moreover, the non-linear I-V characteristic can be provided whether the two-terminal memory cell is in a conductive state or non-conductive state. For instance, a signal below the first threshold magnitude will cause selector device 602D to be in the non-conductive state. In the non-conductive state, selector device 602D will resist current through the series combination of selector device 602D and the two-terminal memory cell when the signal is below the first threshold. When the signal is equal to or above the threshold magnitude, selector device 602D will be conductive, and a state of the two-terminal memory cell can determine electrical characteristics of the series combination of: selector device 602D and the two-terminal memory cell. Thus, activating selector device 602D will facilitate operational access to the two-terminal memory cell. Deactivating selector device 602D will resist operational access to the two-terminal memory cell (e.g., by resisting current through the series combination, and by dropping a majority of the voltage applied across the series combination, etc.). Because selector device 602D is volatile, and in the non-conducting state in the absence of a signal having the first threshold magnitude, the two-terminal memory cell is inaccessible and retains information (e.g., retains a current state thereof). Selector device 602D, on the other hand, provides a non-linear I-V response for the series combination, resisting leakage current and facilitating a memory array having high density.

FIG. 6E illustrates a block diagram depicting operational behavior of an example selector device 602D according to further aspects of the subject disclosure. Selector device 602D can be substantially similar to any selector device disclosed herein, in one or more embodiments. However, the subject disclosure is not so limited.

Operational behavior of selector device 602D is illustrated in response to signals of a second polarity, different from the first polarity of first signal 610D and second signal 612D, described with respect to FIG. 6D, supra. For instance, the second polarity can be opposite or approximately opposite the first polarity, in various embodiments. As an illustrative example, the second polarity can comprise a signal gradient (e.g., voltage gradient, current gradient, joule heating gradient, etc.) that is greater value measured from bottom electrode 602A and lesser value measured from top electrode 606C.

At the top of FIG. 6E, a first signal 610E having magnitude equal to or greater than a second threshold magnitude (or second range of threshold magnitudes, as suitable) is applied at bottom electrode 602A relative to top electrode 606C. Particles of bottom electrode 602A migrate within and through a selector layer 604B in response to first signal 610E. The second threshold magnitude is associated with suitable formation of a conductive path(s) across selector layer 604B, from bottom electrode 602A to top electrode 606C, to induce a conductive state for selector device 602D. Note that in some embodiments, the second threshold magnitude (or range of magnitudes) can be different (different values) from the first threshold magnitude (or range of magnitudes) associated with formation of conductive path(s) from top electrode 606C relative to bottom electrode 602A as depicted by FIG. 6E, supra. Difference in magnitude can occur, for instance, where the top electrode and bottom electrode are formed of different materials having different particle mobility, different ion strength, different size, different shape, or the like. Said differently, employing different materials, sequences of materials (e.g., adding an addition layer—such as a barrier layer—between selector layer 604B and top electrode 606C, or bottom electrode 602A), material properties or characteristics for top electrode 606C or bottom electrode 602A can lead to different threshold voltages associated with filament formation from top electrode 606C to bottom electrode 602A (as depicted in FIG. 6D) as compared with filament formation from bottom electrode 602A to top electrode 606C (as depicted in FIG. 6E).

As depicted by FIG. 6E, formation of the conductive path(s) can comprise suitable particles of bottom electrode 602A migrating through selector layer 604B, from bottom electrode 602A to top electrode 606C, or pre-existing metal particles in selector layer 604B aligning/migrating to form the conductive path(s) (e.g., where the selector layer is doped with metal particles). At the bottom of FIG. 6E, a second signal 612E having magnitude less than the second threshold magnitude (or range of magnitudes) is applied at bottom electrode 602A. In response to the second signal, particles of the conductive path(s) disperse through selector layer 604B (or toward/into bottom electrode 602A), at least in part deforming the conductive path(s). This induces a non-conductive state for selector device 602D. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 602D. To reiterate the above, in various embodiments herein, it should be understood that reference to a threshold voltage may actually refer to a set of threshold voltages (from a narrow range of voltages) depending on whether a conductive path is formed or deformed.

In other embodiments, if polarity of the voltage source is defined as positive to negative relative to top electrode 606C and bottom electrode 602A, below the lowest threshold magnitude from a narrow range of magnitudes, the conductive path(s) can be formed sufficiently enough to cause the conductive state for selector device 602D, whereas at or above the highest threshold magnitude from the narrow range of magnitudes, the conductive path(s) is at least in part deformed. Examples of this will be illustrated, below.

In various embodiments, selector device 602D can have the properties described above with respect to selector device 602D in response to a signal of the first polarity. Thus, selector device 602D can form a conductive path(s) comprising particles from top electrode 606C extending through selector layer 604B in response to a signal of the first polarity, and can form a second conductive path(s) comprising particles from bottom electrode 602A extending through selector layer 604B in response to a signal of the second polarity. In at least some embodiments, the conductive path can at least in part comprise particles of bottom electrode 602A (e.g., near to a boundary of bottom electrode 602A), and likewise the second conductive path can at least in part comprise particles of top electrode 606C (e.g., near to a boundary of top electrode 606C). Thus, selector device 602D can have a first threshold magnitude to facilitate transition to a first conducting state along the first polarity, and a second threshold magnitude to facilitate transition to a second conductive state along the second polarity. This operation can be implemented in conjunction with a bipolar memory cell, providing non-linear I-V characteristics for first polarity signals as well as for second polarity signals. In pragmatic terms, bidirectional non-linear I-V characteristics can facilitate resistance to leakage currents from either positive or negative polarity signals. Thus, the series combination of selector device 602D and a two-terminal memory cell can mitigate leakage current resulting from a programming signal or read signal (e.g., having a first polarity) or an erase signal (e.g., having the second polarity). In at least some embodiments, it should be appreciated that this description of selector device 602D (and other suitable descriptions for FIG. 6E), can have analogous applicability to selector device 602D of FIG. 6D, supra. Also, the reverse is true; illustrative embodiments described with respect to selector device 602D of FIG. 6D can be applicable to selector device 602D of FIG. 6E in suitable embodiments. Accordingly, the example embodiments described for FIGS. 6E and 6D should be considered interchangeable, where suitable.

In various embodiments, selector device 602D can be operated within a set of operational parameters. In some embodiments, the set of operational parameters can be selected to maintain volatile state-switching of selector layer 604B (e.g., by forming a relatively weak filament, which at least in part deforms below a threshold signal magnitude), provide switching longevity, achieve a target power consumption, or the like, or a suitable combination thereof. In some embodiments, current through selector device 602D (and, e.g., the series combination of selector device 602D and a two-terminal memory cell) can be limited to a maximum current value.

For instance, the maximum current value can be limited to 300 microamps (µA) or below, 300 µA or below, or another suitable maximum value. In other embodiments, selector layer 604B can have a thickness maintained within a target range of thicknesses. For example, the thickness of selector layer 604B can be from about 0.5 nanometers (nm) to about 50 nm. In various embodiments, based upon current experimental data, typical thicknesses which provide surprisingly effective results based upon a threshold voltage of about 1 volt may be within a range of about 1 to about 20 nm, and more specifically about 1 nm to about 10 nm. In at least one embodiment, the thickness of selector layer 604B (or, e.g., selector layer 604B of FIG. 6D, supra) can be selected to provide a signal threshold magnitude (e.g., voltage threshold, current threshold, field strength threshold, etc.) associated with state-switching of selector device 602D to have a target value, or be within a target range. As one illustrative example, the thickness can be selected to provide a threshold voltage associated with state-switching to be between about 0.1 volts and about 4 volts. Maintaining the threshold voltage at a target value can mitigate or avoid formation of a non-volatile filament.

In some embodiments, a stoichiometric value(s) of material utilized for selector layer 604B can be provided at a target value. For instance, a stoichiometric value for 'x' for a $SiO_x$ selector layer 604B can be between about 0.5 and about 2. In at least one embodiment, the stoichiometric value can be selected to achieve a target width for a conductive path (e.g., filament) through selector layer 604B. In some embodiments, increasing stoichiometric value(s) of the material utilized for selector layer 604B can reduce defect density of selector layer 604B (e.g., density of dangling bonds, density of particle voids, and so forth), and the stoichiometric value can be selected to achieve a target defect density to provide the target width for the conductive path. In at least one disclosed embodiment, selector layer thickness and stoichiometric value can be respectively selected to achieve a target trade-off between maximum threshold voltage and maximum defect density.

The aforementioned diagrams have been described with respect to interaction between several components (e.g., layers) of a memory cell, a conductive electrode or resistive switching layer thereof, or a memory architecture comprised of such memory cell. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

Figure 7:
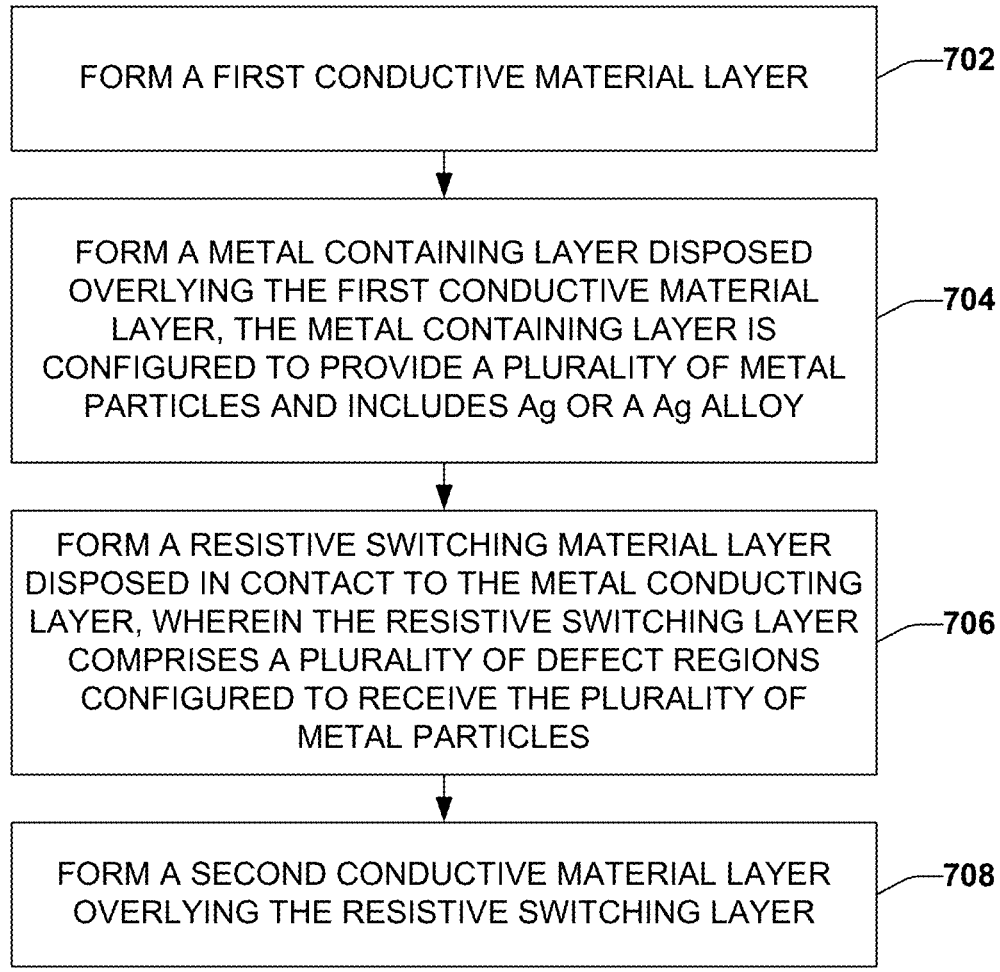
FIG. 7 illustrates a flowchart of a sample method for forming a non-volatile resistive memory device having a silver-based contact, in an embodiment(s)
Figure 9:
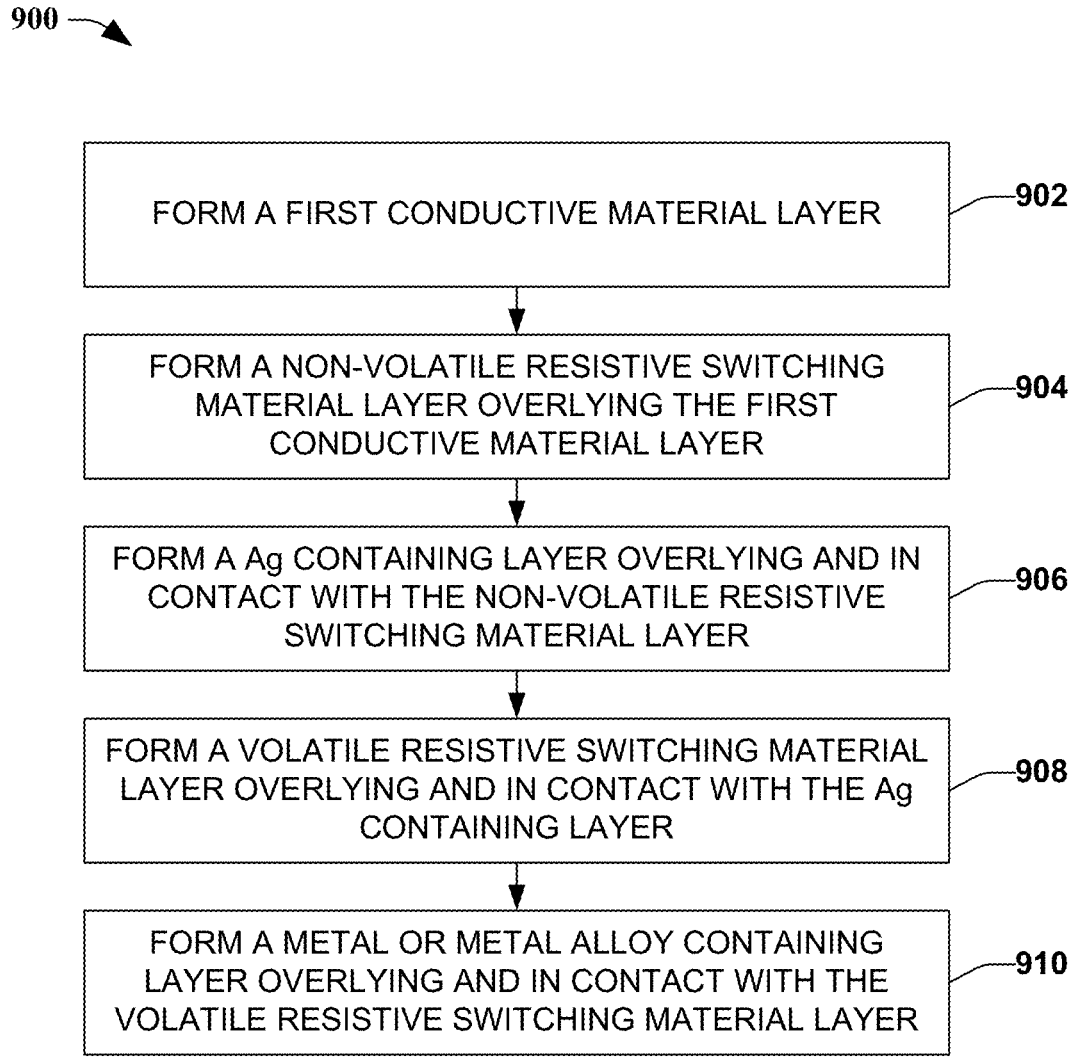
FIG. 9 illustrates a flowchart of an example method for forming a memory cell comprising a volatile selector device and non-volatile memory device.

In view of the exemplary diagrams described supra, process methods that can be implemented in accordance with the disclosed subject matter will be better appreciated with reference to the flow charts of FIGS. 7-9. While for purposes of simplicity of explanation, the methods of FIGS. 7-9 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 illustrates a flowchart of a sample method 700 for fabricating a non-volatile resistive switching memory device, according to embodiments of the present disclosure. At 702, method 700 can comprise forming a first conductive material from a first conducting material layer. At 704, method 700 can comprise forming a metal containing layer disposed overlying or in contact to the first conductive material layer. Further, the metal containing layer can be configured to provide a plurality of metal particles and includes Ag or a Ag alloy, in various embodiments. In one embodiment, the metal containing layer can be Ag metal with about 0.1% to about 10% of a non-silver material (e.g., a semiconductor material, a metal oxide, a metal nitride, a metal, etc.). In another embodiment, the metal containing layer can comprise a base material (e.g., a semiconductor material, a metal oxide, a metal nitride, a metal, etc.) comprising from about 1% to about 50% Ag particles, by atomic %. At 706, method 700 can comprise forming a resistive switching material layer disposed overlying the metal conducting layer and the bottom electrode. In an embodiment, the resistive switching material layer can be in contact with the metal conducting layer. Further, the resistive switching material layer can be formed to have a plurality of defect regions configured to receive the plurality of metal particles. At 708, method 700 can comprise forming a second conductive material layer overlying the resistive switching layer. In an embodiment, the second conductive material layer can be in contact to the resistive switching material layer.

FIG. 8 illustrates a flowchart of a sample method 800 according to further embodiments of the present disclosure. At 802, method 800 can comprise forming a first metal containing layer configured to provide a first plurality of metal particles. At 804, method 800 can comprise forming a second metal containing layer overlying the first metal containing layer and configured to provide a second plurality of metal particles. At 806, method 800 can comprise forming a selector material layer disposed between or in contact with the first metal containing layer and the second metal containing layer, and comprising a plurality of defect regions configured to receive the first plurality of metal particles in response to a first stimulus and to receive the second plurality of metal particles in response to a second stimulus of opposite polarity to the first stimulus.

FIG. 9 depicts a flowchart of a sample method 900 according to alternative or additional embodiments of the present disclosure. At 902, method 900 can comprise forming a first conductive material layer. The first conductive material layer can be provided overlying a substrate of an integrated circuit device, with one or more optional intervening layers. At 904, method 900 can comprise forming a non-volatile resistive switching material layer overlying the first conductive material layer. At 906, method 900 can comprise forming a Ag containing layer overlying and in contact with the non-volatile resistive switching material layer. The Ag containing layer can comprise a Ag alloy material (e.g., comprising about 90% to about 99.9% Ag by atomic weight), or a base material comprising Ag (e.g., comprising about 1% to about 50% Ag metal). At 908, method 900 can comprise forming a volatile resistive switching material layer overlying and in contact with the Ag containing layer. In addition to the foregoing, method 900 can comprise forming a metal or metal alloy containing layer overlying and in contact with the volatile resistive switching material layer. The metal or metal alloy containing layer can comprise a metal (e.g., Cu, Al, Ag, etc.), a metal alloy (e.g., Ag alloy, Al alloy, Cu alloy, etc.), a noble metal, a noble metal alloy, a metal nitride, a metal oxide, and so forth.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 10 and 11, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

Figure 10:
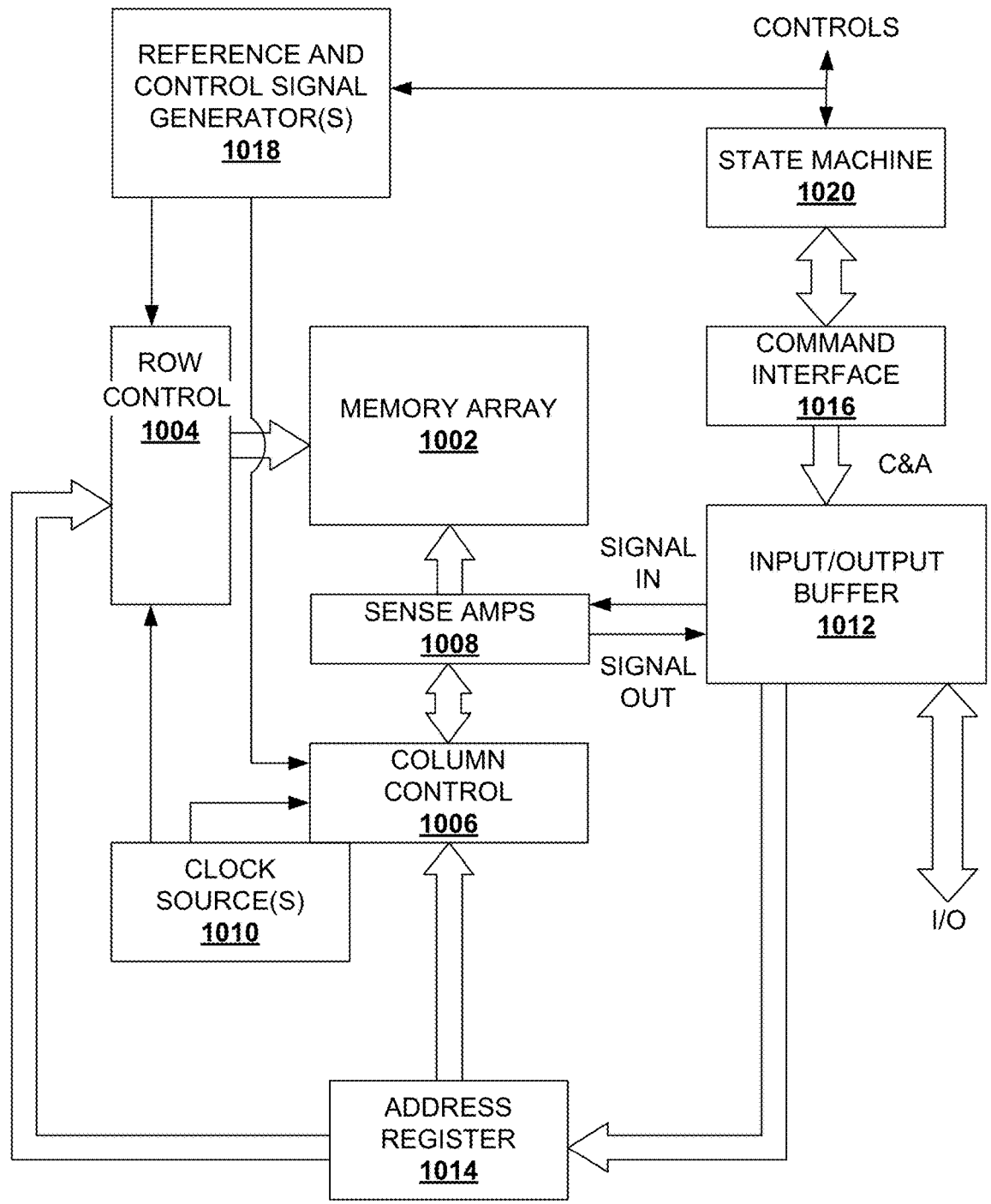
FIG. 10 illustrates a block diagram of a sample operating and control environment for a memory device according to various disclosed embodiments.

FIG. 10 illustrates a block diagram of an example operating and control environment 1000 for a memory array 1002 of a memory cell array according to aspects of the subject disclosure. In at least one aspect of the subject disclosure, memory array 1002 can comprise memory selected from a variety of memory cell technologies. In at least one embodiment, memory array 1002 can comprise a two-terminal memory technology, arranged in a compact two or three dimensional architecture. Example architectures can include a 1T1R memory array, and a 1TnR memory array (or 1TNR memory array), as disclosed herein. Suitable two-terminal memory technologies can include resistive-switching memory, conductive-bridging memory, phase-change memory, organic memory, magneto-resistive memory, or the like, or a suitable combination of the foregoing.

A column controller 1006 and sense amps 1008 can be formed adjacent to memory array 1002. Moreover, column controller 1006 can be configured to activate (or identify for activation) a subset of bit lines of memory array 1002. Column controller 1006 can utilize a control signal provided by a reference and control signal generator(s) 1018 to activate, as well as operate upon, respective ones of the subset of bitlines, applying suitable program, erase or read voltages to those bitlines. Non-activated bitlines can be kept at an inhibit voltage (also applied by reference and control signal generator(s) 1018), to mitigate or avoid bit-disturb effects on these non-activated bitlines.

In addition, operating and control environment 1000 can comprise a row controller 1004. Row controller 1004 can be formed adjacent to and electrically connected with word lines of memory array 1002. Also utilizing control signals of reference and control signal generator(s) 1018, row controller 1004 can select particular rows of memory cells with a suitable selection voltage. Moreover, row controller 1004 can facilitate program, erase or read operations by applying suitable voltages at selected word lines.

Sense amps 1008 can read data from, or write data to the activated memory cells of memory array 1002, which are selected by column control 1006 and row control 1004. Data read out from memory array 1002 can be provided to an input/output buffer 1012. Likewise, data to be written to memory array 1002 can be received from the input/output buffer 1012 and written to the activated memory cells of memory array 1002.

A clock source(s) 1008 can provide respective clock pulses to facilitate timing for read, write, and program operations of row controller 1004 and column controller 1006. Clock source(s) 1008 can further facilitate selection of word lines or bit lines in response to external or internal commands received by operating and control environment 1000. Input/output buffer 1012 can comprise a command and address input, as well as a bidirectional data input and output. Instructions are provided over the command and address input, and the data to be written to memory array 1002 as well as data read from memory array 1002 is conveyed on the bidirectional data input and output, facilitating connection to an external host apparatus, such as a computer or other processing device (not depicted, but see e.g., computer 1102 of FIG. 11, infra).

Input/output buffer 1012 can be configured to receive write data, receive an erase instruction, receive a status or maintenance instruction, output readout data, output status information, and receive address data and command data, as well as address data for respective instructions. Address data can be transferred to row controller 1004 and column controller 1006 by an address register 1010. In addition, input data is transmitted to memory array 1002 via signal input lines between sense amps 1008 and input/output buffer 1012, and output data is received from memory array 1002 via signal output lines from sense amps 1008 to input/output buffer 1012. Input data can be received from the host apparatus, and output data can be delivered to the host apparatus via the I/O bus.

Commands received from the host apparatus can be provided to a command interface 1016. Command interface 1016 can be configured to receive external control signals from the host apparatus, and determine whether data input to the input/output buffer 1012 is write data, a command, or an address. Input commands can be transferred to a state machine 1020.

State machine 1020 can be configured to manage programming and reprogramming of memory array 1002 (as well as other memory banks of a multi-bank memory array). Instructions provided to state machine 1020 are implemented according to control logic configurations, enabling state machine to manage read, write, erase, data input, data output, and other functionality associated with memory cell array 1002. In some aspects, state machine 1020 can send and receive acknowledgments and negative acknowledgments regarding successful receipt or execution of various commands. In further embodiments, state machine 1020 can decode and implement status-related commands, decode and implement configuration commands, and so on.

To implement read, write, erase, input, output, etc., functionality, state machine 1020 can control clock source(s) 1008 or reference and control signal generator(s) 1018. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
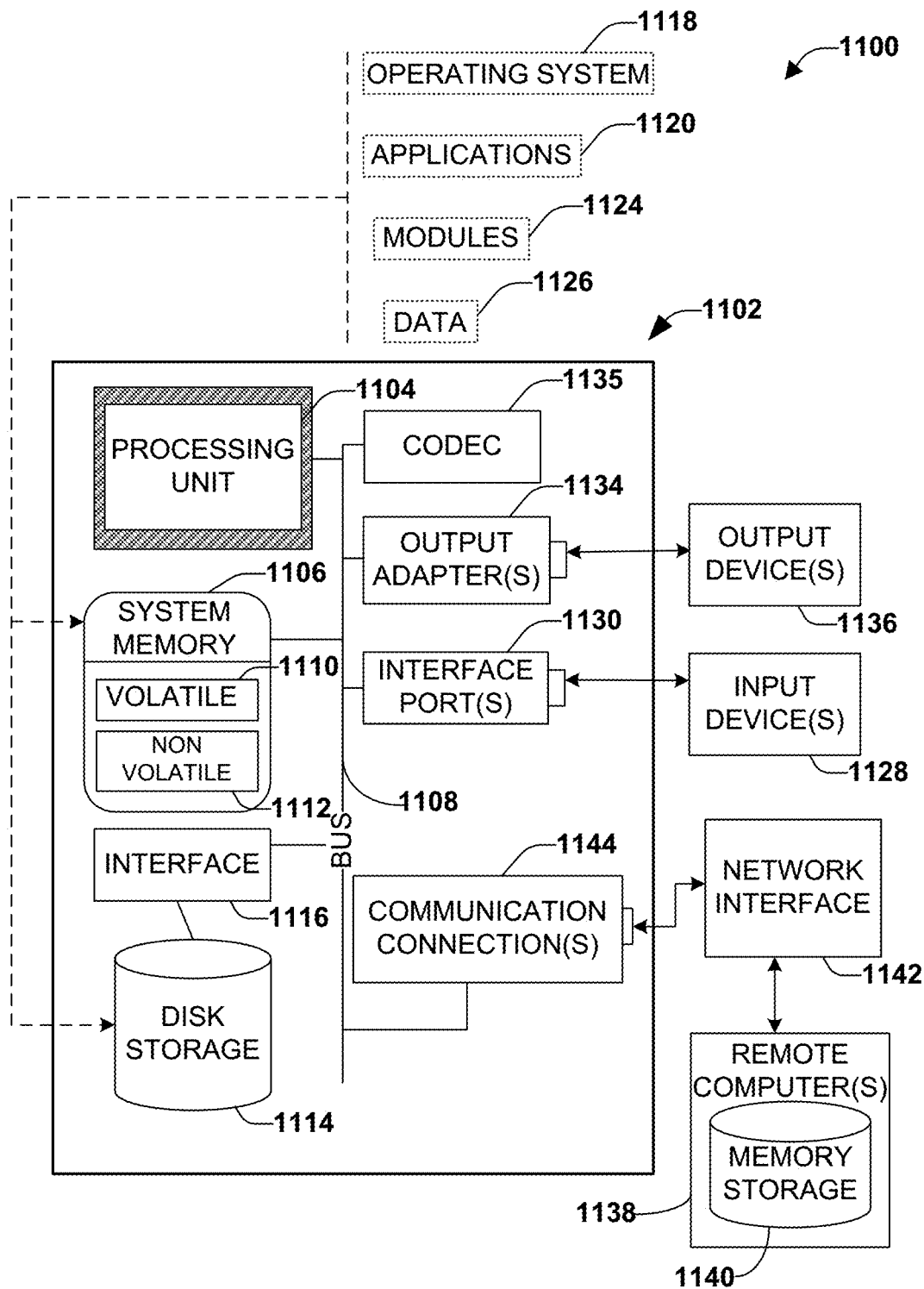
FIG. 11 illustrates a block diagram of an example computing environment that can be implemented in conjunction with various embodiments.

With reference to FIG. 11, a suitable operating environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1114, which can employ one or more of the disclosed memory architectures, in various embodiments. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or Flash memory. Non-volatile memory 1112 can employ one or more of the disclosed memory architectures, in at least some disclosed embodiments. Moreover, non-volatile memory 1112 can be computer memory (e.g., physically integrated with computer 1102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1110 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1102 may also include removable/non-removable, volatile/non-volatile computer storage medium. FIG. 11 illustrates, for example, disk storage 1114. Disk storage 1114 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1114 to the system bus 1108, a removable or non-removable interface is typically used, such as interface 1116. It is appreciated that disk storage 1114 can store information related to a user. Such information might be stored at or provided to a server or to an application running on a user device. In one embodiment, the user can be notified (e.g., by way of output device(s) 1136) of the types of information that are stored to disk storage 1114 and/or transmitted to the server or application. The user can be provided the opportunity to opt-in or opt-out of having such information collected and/or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102, and to output information from computer 1102 to an output device 1136. Output adapter 1134 is provided to illustrate that there are some output devices, such as monitors, speakers, and printers, among other output devices, which require special adapters. The output adapter 1134 can include, by way of illustration and not limitation, video and sound cards that provide a means of connection between the output device 1136 and the system bus 1108. It should be noted that other devices and/or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1144 refers to the hardware/software employed to connect the network interface 1142 to the system bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A resistive memory device, comprising:
a first conductive material layer;
an active metal containing layer disposed in contact to the first conductive material layer;
a resistive switching material layer disposed in contact to the active metal containing layer and comprising a switching material selected from a group consisting essentially of: an undoped amorphous Si, a silicon nitride, a silicon sub-oxide of the form SiOx where x has a value between 0.1 and 2, a silicon sub-nitride, a non-stoichiometric oxide, a non-stoichiometric nitride, a metal-nitride and an aluminum and nitrogen compound; and
a second conductive material layer disposed in contact to the resistive switching layer; wherein:
the active metal containing layer comprises an alloy of a metal and a second material and is configured to provide a plurality of metal particles of the metal, wherein the metal particles are selected from a group consisting of: aluminum particles, copper particles, chromium particles, and iron particles and wherein the active metal containing layer comprises 0.1% to about 10% of the second material by atomic weight, and comprises about 90% to 99.9% of the metal by atomic weight,
the second conductive material layer has an electrical resistance from a few hundred ohms to a few kilo-ohms (Kohms), and
the resistive switching material layer comprises a plurality of defect regions configured to receive the plurality of metal particles.

2. The resistive memory device of claim 1, wherein the switching material comprises the non-stoichiometric oxide; and
wherein the second material is selected from a group consisting of: Si, Ge, Ga, Ti, Al, Cu, TiO and a metal nitride.

3. The resistive memory device of claim 1, further comprising a selector device arranged electrically in serial to the resistive memory device, the selector device being a two-terminal volatile resistive switching device comprising:
a first metal containing layer wherein the first metal containing layer is configured to provide a first plurality of metal particles;

a second metal containing layer wherein the second metal containing layer is configured to provide a second plurality of metal particles; and a selector material layer disposed between and in contact to the first metal containing layer and the second metal containing layer, wherein the selector material layer comprises a plurality of defect regions configured to receive the first plurality of metal particles and form a first conductive filament through the selector material layer in response to a first polarity stimulus applied to the selector device, and to receive the second plurality of metal particles and form a second conductive filament through the selector material layer in response to a second polarity stimulus applied to the selector device.

4. The resistive memory device of claim 3, wherein the selector device has a first electrical resistance in response to formation of the first conductive filament or the second conductive filament and a second electrical resistance, larger than the first electrical resistance, absent formation of the first conductive filament or the second conductive filament.

5. The resistive memory device of claim 3, wherein the first polarity stimulus is of opposite polarity from the second polarity stimulus.

6. The resistive memory device of claim 3, wherein the second metal containing layer includes an alloy of silver that comprises about 90% to about 99.9% silver by atomic weight.

7. The resistive memory device of claim 6, wherein the alloy of silver also comprises from about 0.1% to about 10% by atomic weight of a material selected from a group consisting of: Si, Ge, Ga, As, Ti, Al, Cu, Pt, Pd, W, TiN, WN, AlN, a non-stoichiometric metal oxide (MOx), AlOx, TiOx, and CuOx.

8. The resistive memory device of claim 3, wherein the second metal containing layer includes an alloy of silver that comprises about 1% to about 50% silver by atomic weight.

9. The resistive memory device of claim 8, wherein the alloy of silver comprises about 50% to about 99% of a second material that is not silver.

10. The resistive memory device of claim 3, wherein the resistive switching material layer is a non-volatile memory layer, and wherein activation of the selector device facilitates electrical access to the resistive memory device.

11. A method for fabricating a memory device, comprising:
forming a first conductive material layer overlying a substrate of the memory device;
forming an active metal containing layer comprising an alloy of a metal selected from a group consisting of: aluminum, copper, chromium, iron and silver and a second material, and comprises 0.1% to about 10% of the second material by atomic weight and comprises about 90% to 99.9% of the metal by atomic weight, and overlying the first conductive material layer;
forming a resistive switching material layer disposed in contact with the active metal containing layer; and
forming a second conductive material layer in contact with the resistive switching material layer, wherein:
the active metal containing layer is selected to provide metal particles to the resistive switching material layer, the metal particles selected from the group consisting of: aluminum, copper, chromium, iron and silver,
the resistive switching material layer comprises a plurality of defect regions configured to receive the metal particles provided by the active metal containing layer,
the active metal containing layer is disposed in contact to the first conductive material layer,
the resistive switching material layer is disposed in contact to the active metal containing layer and comprises a switching material selected from a third group consisting essentially of: an undoped amorphous Si, a silicon nitride, a silicon sub-oxide of the form SiOx where x has a value between 0.1 and 2, a silicon sub-nitride, a non-stoichiometric oxide, a non-stoichiometric nitride, a metal-nitride and an aluminum and nitrogen compound, and
the second conductive material layer is disposed in contact to the resistive switching material layer and has an electrical resistance from a few hundred ohms to a few kiloohms.

12. The method of claim 11, wherein the active metal containing layer and the resistive switching layer are configured so that the metal particles form a conductive filament through the resistive switching material layer in response to a stimulus applied to the memory device.

13. The method of claim 11, further comprising forming the active metal containing layer as a silver alloy comprising about 90% to about 99.9% by atomic weight silver.

14. The method of claim 11, further comprising forming the active metal containing layer with the second material selected from a group consisting of: Si, Ge, Ga As, Ti, Al, Cu, Pt, Pd, W, TiN, WN, AlN, a non-stoichiometric metal oxide (MOx), AlOx, TiOx, and CuOx.

15. The method of claim 11, further comprising:
forming a second resistive switching material layer in contact with the active metal containing layer, wherein the second resistive switching material layer is a volatile selector material layer, the resistive switching material layer is a non-volatile memory layer, the resistive switching material layer is formed in contact with a first surface of the active metal containing layer and the second resistive switching material layer is formed in contact with a second surface of the active metal containing layer; and
forming a second metal containing layer in contact with the second resistive switching material layer, wherein the second metal containing layer is selected to be at least one of:
about 90% to about 99.9% by atomic weight silver with about 10% to about 0.1% a second metal that forms an alloy with the silver; or
about 1% to about 50% by atomic weight of a third material that includes from about 50% to about 99% by atomic weight silver.

16. The resistive memory device of claim 3, wherein the selector material layer has a thickness in a range from 1 nanometer (nm) to 20 nm.

17. The resistive memory device of claim 3, wherein the selector material layer has a thickness in a range from 1 nm to 10 nm.

18. The method of claim 15, wherein the second resistive switching material layer has a thickness in a range from 1 nm to 20 nm.

19. The method of claim 15, wherein the second resistive switching material layer has a thickness in a range from 1 nm to 10 nm.

* * * * *